United States Patent
Bayer et al.

(12)

(10) Patent No.: US 6,246,557 B1
(45) Date of Patent: Jun. 12, 2001

(54) LOSS OF GROUND PROTECTION FOR ELECTRONIC RELAYS

(75) Inventors: Erich Bayer, Erjolding; Eckart Müller, München; Martin Rommel, Freising, all of (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/215,853

(22) Filed: Dec. 18, 1998

Related U.S. Application Data

(60) Provisional application No. 60/081,475, filed on Apr. 10, 1998, and provisional application No. 60/094,966, filed on Jul. 31, 1998.

(51) Int. Cl.[7] .................................................. H02H 3/18
(52) U.S. Cl. .............................................. 361/42; 361/86
(58) Field of Search .............................. 361/42, 54–57, 361/78, 86, 88, 245; 340/661

(56) References Cited

U.S. PATENT DOCUMENTS

| | | | |
|---|---|---|---|
| 4,808,839 | * | 2/1989 | Dunn et al. .......................... 327/546 |
| 4,949,142 | * | 8/1990 | Contiero et al. ..................... 357/23.4 |
| 5,166,852 | * | 11/1992 | Sano ....................................... 361/42 |
| 5,305,176 | * | 8/1990 | Hirota ................................. 361/205 |
| 5,418,673 | * | 5/1995 | Wong ..................................... 361/18 |

FOREIGN PATENT DOCUMENTS

A1 0 337 857   4/1989 (EP) .............................. H03K/17/06

OTHER PUBLICATIONS

Robert Liou, "Es werde Licht", Jun. 2, 1996, Design & Elektronik 3, pp. 8,10.

* cited by examiner

*Primary Examiner*—Michael J. Sherry
*Assistant Examiner*—Kim Huynh
(74) *Attorney, Agent, or Firm*—Wade James Brady, III; Frederick J. Telecky, Jr.

(57) ABSTRACT

A loss-of-ground protection circuit for an electronic relay including a control circuit driving a power transistor, and at least one cutoff transistor having a grounded control terminal, the cutoff transistor being interposed between the control circuit and a control terminal of the power transistor, and having a polarity such that loss of ground will cause the cutoff transistor to turn off.

7 Claims, 2 Drawing Sheets

LOSS OF GROUND PROTECTION FOR ELECTRONIC RELAYS

This application claims priority under 35 USC §119(e)(1) of provisional U.S. application Ser. No. 60/081,475 mfiled Apr. 10, 1998 and U.S. application Ser. No. 60/094,966 filed Jul. 31, 1998.

BACKGROUND AND SUMMARY OF THE INVENTION

The present invention relates to electronic relays and high-side drivers.

BACKGROUND

Electronic Relays

Relays are in widespread use in industry. In particular, electronic relays are gaining popularity over mechanical relays in many areas where advances in technology by way of processes and packaging provide for their application.

Electronic relays may comprise, for example, an integrated driver control circuit which controls a separate power output driver (transistor or other solid-state device) which can switch loads demanding high power. Both the driver control circuit and the output driver may comprise active devices which are sensitive to voltage fluctuations. These unwanted fluctuations may cause the device to turn on at the moment it is intended to be off. Thus good grounding practices are an essential factor in reducing the possibility of device turn-on as a result of voltage fluctuations.

A particular concern with electronic relays in the automotive industry is that the ground voltage of the load (e.g. a battery or alternator) may be different than the ground voltage of the electronic relay. This is a problem particularly in automotive environments, where dirty connections can cause a shift in contact resistance, and high currents are common. As a result, present electronic relay designs may behave erratically if the ground potentials are sufficiently different. For example, if the relay ground rises sufficiently above the load ground, active device threshold voltages may be exceeded, resulting in the device turning on when it should not be on.

Automotive applications also offer an operating environment which can be harsh due to vibrations and wide temperature excursions. As a result, relay connections may be the source of numerous problems due to thermal creep, vibration, or even inadvertent error by a person performing maintenance on the system where the connection is not replaced. Furthermore, in some systems, the connection may not be designed in such a way to prevent it from being reinserted the wrong way. Consequently, a person may incorrectly reconnect a cable where, for example, the ground terminal is connected to a potential other than ground. Again, the potential for active device turn-on exists when the possibility of relay ground sufficiently exceeds the load ground potential.

Prior-Art Protection Circuit

FIG. 2 illustrates a prior-art electronic relay loss-of-ground protection circuit. The minimum gate potential that the drive circuit 202 of electronic relay 200 can provide for the output driver (e.g. a power N-CH DMOS) Q3 is the voltage of the driver control circuit ground reference $GND_R$ (also relay ground). If the ground potential of the load $GND_L$ has a lower voltage potential than the driver control circuit ground reference $GND_R$, then the minimum gate-to-source voltage of the output driver Q3 cannot be less than the voltage difference between the references, $GND_L$ and $GND_R$. If this voltage difference is greater than the threshold voltage of the output driver Q3, then the output driver Q3 cannot be switched off.

In a worst case condition where relay ground $GND_R$ is lost, or inadvertently connected to the battery voltage $V_{BAT}$, the full battery voltage is applied between the gate and source of the output power transistor Q3.

Sample Protection Circuit

FIG. 3 shows an improvement to the prior-art circuit of FIG. 2, using an additional discrete transistor Q1 (located outside the dotted-line boundary of the integrated circuit) to provide loss-of-ground protection. In this scenario, when the relay ground potential $GND_R$ is substantially greater than the load ground potential $GND_L$, transistor Q1 inhibits the output driver Q3 from turning on. The transistor Q1 (e.g. a bipolar NPN in this embodiment), biased by resistor R1 to turn on during a rise in voltage at relay ground $GND_R$, conducts because of a positive base-emitter voltage ($V_{be}$), and effectively shorts out the gate-source nodes of the output driver Q3. Consequently, the output driver Q3 is turned off.

Resistors R2 and R3 limit the currents through respective parasitic well diodes D2 and D1 of the driver control circuit 302. A major disadvantage of this solution is that the additional discrete transistor Q1 cannot be integrated onto the same chip as the output driver Q3 without introducing undesirable process side-effects. For example, integration of the transistor Q1 automatically generates a parasitic well diode from the relay ground node $GND_R$ to the collector of the transistor Q1. Therefore, the undesirable constraints of FIG. 2 are reintroduced where the gate voltage of the output driver Q3 cannot be less than one $V_{be}$ drop with respect to relay ground $GND_R$.

Innovative Structures and Methods

The present application discloses a loss-of-ground protection circuit for an electronic relay comprising a control circuit driving a power transistor, and at least one cutoff transistor having a grounded control terminal. The cutoff transistor is interposed between the control circuit and a control terminal of the power transistor, and has a polarity such that loss of ground will cause the cutoff transistor to turn off.

The innovative circuit advantageously provides loss-of-ground protection for electronic relays, and prevents the power DMOS output transistor from switching on improperly when ground is lost.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Electronic relays used in automotive applications usually have the problem that the ground connection of the load is not the same as the ground connection of the relay.

Innovative Loss-of-Ground Protection Circuit

Figure 1:
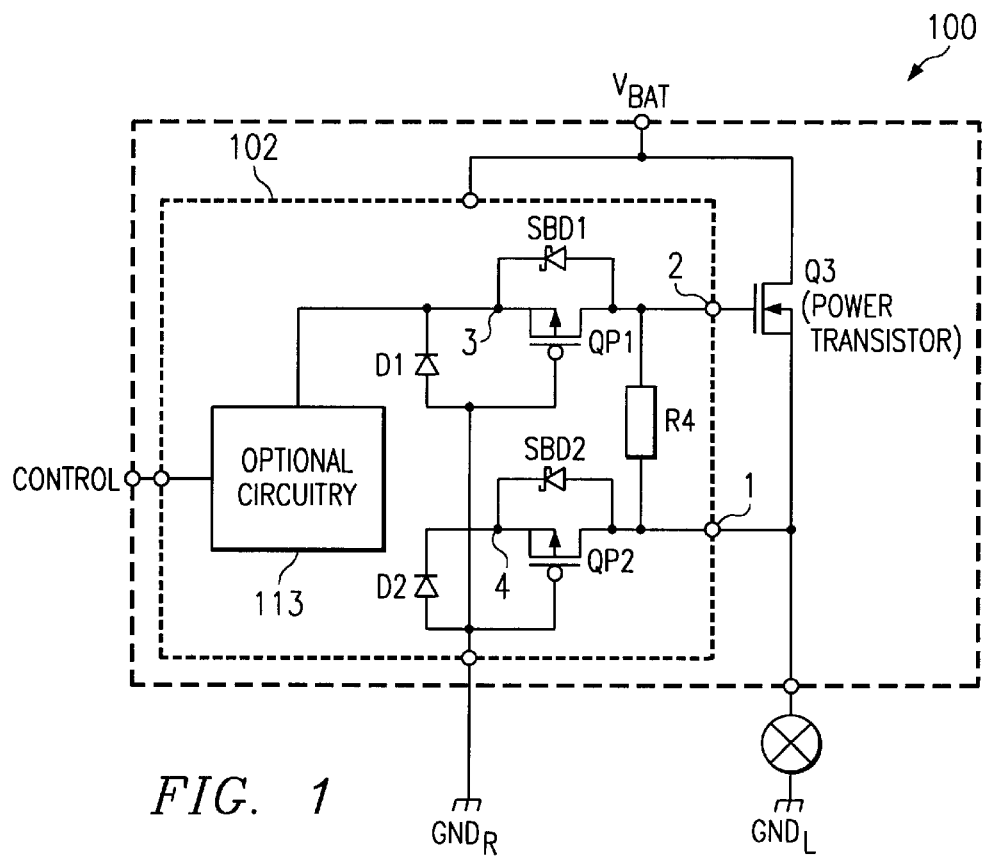
FIG. 1 shows a preferred embodiment of the innovative ground protection circuit.
Figure 2:
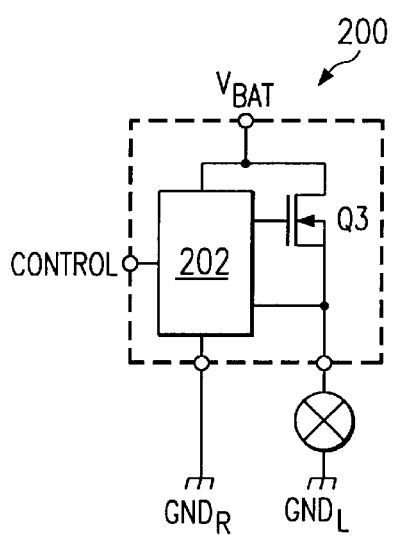
FIG. 2 shows a prior-art electronic relay circuit.
Figure 3:
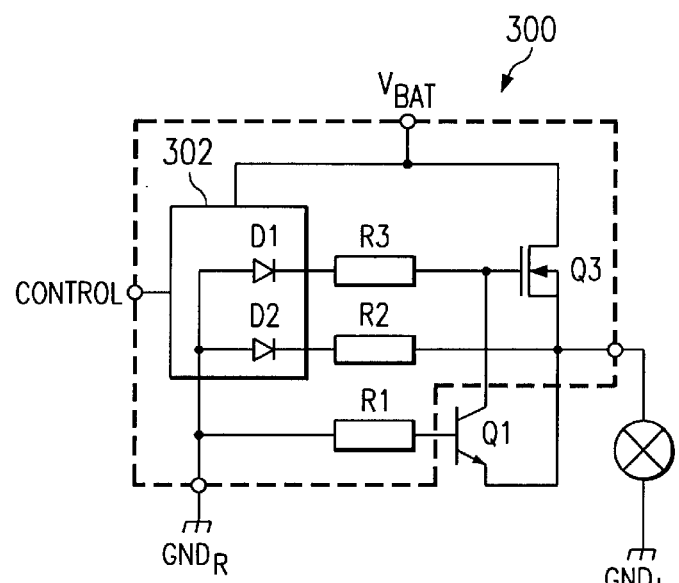
FIG. 3 shows an improvement to the prior-art circuit of FIG. 2 in accordance with the prior art.

FIG. 1 shows a preferred embodiment of the innovative ground protection circuit, which does not require any discrete components. The circuit can be implemented using an integrated high-voltage N-channel DMOS on the driver chip. Unlike the circuit of FIG. 3, there is no need for an external NPN transistor. Another advantage is that there are no parasitic diodes on the gate of the power DMOS high-side driver ("HSD") Q3. The driver control circuit 102 of the electronic relay 100 implements a pair of PMOS transistors (QP1 and QP2) to cancel the effects of the parasitic diodes D1 and D2, respectively. When the output driver Q3 is switched on, the voltage at Nodes 1, 2, 3, and 4, is positive with respect to the voltage at relay ground $GND_R$. Since the gates of transistors QP1 and QP2 are negative with respect to their respective sources (Nodes 3 and 4), transistors QP1 and QP2 are switched on, and connect the driver control circuit 102 to the output driver Q3. When the output driver Q3 is switched off, Nodes 3 and 4 are at the same voltage as relay ground $GND_R$. Transistors QP1 and QP2 are switched off when the voltage at Nodes 3 and 4 falls below the threshold voltage of the transistors QP1 and QP2. When this occurs, transistors QP1 and QP2 isolate the respective parasitic diodes D1 and D2 of the driver control circuit 102 from the output driver Q3. A resistor R4 (e. g., a poly-resistor which is isolated by oxide and creates no parasitic diodes) keeps the output driver Q3 off. This allows both gate and source voltages of the output driver Q3 to be much lower than the voltage at relay ground $GND_R$. Schottky diodes SBD1 and SBD2 are placed across the drain-source of respective transistors QP1 and QP2 to negate the effects of parasitic currents in the drain-to-backgate diodes inherent in transistors like QP1 and QP2. The Schottky diodes prevent latchup with the high voltage transients which are common in an automotive environment. The breakdown voltage (BVDSS) of each PMOS transistor and associated Schottky diode used in the process is approximately 50 V, which is much higher than the voltage of a car battery.

Since transistors QP1 and QP2 are switched off when relay ground $GND_R$ is lost or substantially greater than load ground $GND_L$, only the poly-resistor R4 remains functionally connected across the gate-source terminals of the output driver Q3 to keep it turned off.

Note that FIG. 1 is a schematic diagram which emphasizes the loss-of-ground protection at the output. Other functions (shown generally in FIG. 1 as "optional circuitry 113") may of course be interposed between the control input and the source of transistor QP1. These other functions can include, for example, level shifting, de- glitching (i.e. filtering to remove transients), clamping, and/or other functions.

Figure 4:
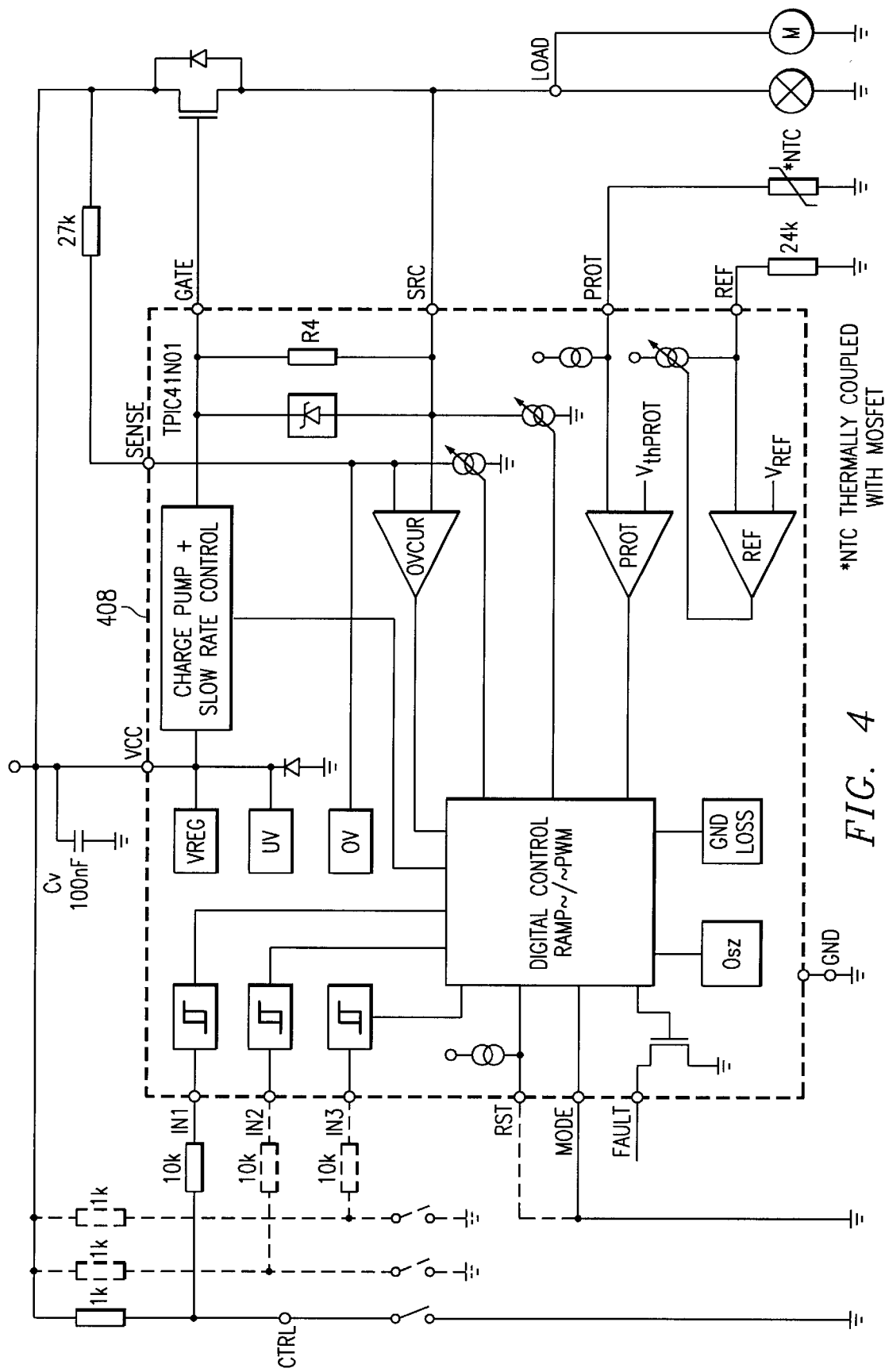
FIG. 4 shows an example of a mixed-signal device in which the circuit of FIG. 1 is advantageously included.

FIG. 4 shows an example of a mixed signal chip which uses the innovative protection circuit. The chip in this example is a TPIC41HO1 manufactured by Texas Instruments. This is a single-channel pulse-width modulated ("PWM") high side FET predriver, which is used, for example, in solid state relay applications. The device is targeted to drive an external DMOS power transistor (for example, transistor Q3), while providing different PWM modes and protection functions according to automotive requirements. In this example, one of the PWM modes is for continuous dimming of the load at 38% or 66% duty cycle (e.g., dimming headlamps for daylight use), and the second PWM mode is a soft-start feature (for use e.g., in motor control). The device needs a minimum of external components (primarily for protection against high voltage). All other functions like oscillator, digital control of the PWM functions, slew rate control, and charge to control the gate of the DMOS transistor, are integrated. The TPIC41H01 protects the external DMOS transistor against overload and short circuit. An external temperature sensor NTC close to the DMOS transistor can feed an overtemperature signal to the device to shut down the gate. The output transistor Q3 is controlled by a circuit 405. Circuit 400 comprises, in this case, a resistor R4 across the gate-source of transistor Q3, with a value of approximately 1 MΩ.

Following is a table of terminal functions of this chip.

Terminal Functions

| Terminal Name | No. | I/O | Description |
|---|---|---|---|
| RST | 1 | I | Restart/test clock input |
| IN3 | 2 | I | PWM mode input 3 |
| FAULT | 3 | O | Fault output |
| no | 4 | | Not connected |
| MODE | 5 | | To be connected to GND |
| REF | 6 | I | Reference resistor |
| GND | 7 | | Ground |
| VCC | 8 | | Supply voltage |
| SENS | 9 | I | Drain/supply voltage sense input |
| GATE | 10 | O | Gate control output |
| SRC | 11 | I | Source input |
| IN2 | 12 | I | PWM mode input 2 |
| IN1 | 13 | I | PWM mode input 1 |
| PROT | 14 | I | Temperature protection input |

Recommended Operating Conditions

| Parameter | Min. | Nom. | Max. | Unit |
|---|---|---|---|---|
| $V_{CC}$ Supply Voltage | 5 | | 16 | V |
| $R_{REF}$ Reference resistor (+/- 1%, TC < 100 ppm/K) | | 24 | | kΩ |
| $t_{amb}$ Operating temperature range | −40 | | 125 | ° C. |

NOTE: All voltage values are measured with respect to the ground terminal.

Function Table and Truth Tables

| IN1 | IN2 | IN3 | Mode | | |
|---|---|---|---|---|---|
| High | High | High | Quiescent | | |
| High | High | Low | Quiescent | | |
| High | Low | High | PWM | 38% | 60 Hz |

-continued

Function Table and Truth Tables

| IN1 | IN2 | IN3 | Mode | | |
|---|---|---|---|---|---|
| High | Low | Low | PWM soft start | | 45 Hz |
| Low | High | High | PWM | 66% | 60 Hz |
| Low | High | Low | PWM | 66% | 60 Hz |
| Low | Low | High | DC | | 100% |
| Low | Low | Low | Quiescent | | |

| RST | Mode |
|---|---|
| Low | Auto Restart |
| High | Restart only after switching into quiescent mode; applicable only for short circuit failures |

| Mode | Mode |
|---|---|
| Low | Normal Operation |
| High | Extended mode/Test mode |

TABLE 2

Output Decode Table

| Fault | Status Information |
|---|---|
| Low | Overcurrent or overtemperature fault |
| High | Normal Operation |

Alternative Embodiment
One Intercept Transistor

In an alternative embodiment, only one transistor (QP1) may be required to provide the desired result, according to the circuit of FIG. 1.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, if the circuit of FIG. 1 is used in a positive-ground system, NMOS devices may be used instead of PMOS devices.

What is claimed is:

1. A power transistor driver circuit, comprising:

control circuitry for driving a power transistor; and at least one cutoff transistor having a grounded control terminal, said cutoff transistor having a polarity such that loss of ground will cause said cutoff transistor to turn off, said cutoff transistor being interposed between said control circuitry and a control terminal of said power transistor.

2. The circuit of claim 1, further comprising a leak-down resistor connected between said control terminal of said power transistor and at least one current-carrying terminal of said power transistor.

3. The circuit of claim 1, further comprising an additional cutoff transistor, interposed between a load connection of said power transistor and a ground connection of said control circuitry, said additional cutoff transistor also having a grounded gate.

4. The circuit of claim 1, wherein each said cutoff transistor is a PMOS transistor.

5. The circuit of claim 4, wherein said power transistor is an N-channel DMOS transistor.

6. The circuit of claim 1, further comprising an additional non-parasitic diode connected across the current-carrying terminals of each said cutoff transistor.

7. The circuit of claim 6, further comprising a parasitic diode connected across the control terminal and a current-carrying terminal of each said cutoff transistor.

* * * * *